United States Patent
Baek et al.

(10) Patent No.: US 12,457,865 B2
(45) Date of Patent: Oct. 28, 2025

(54) DISPLAY DEVICE

(71) Applicant: LG Display Co., Ltd., Seoul (KR)

(72) Inventors: JungSun Baek, Paju-si (KR); Seongjoo Lee, Goyang-si (KR); Changhyun Song, Goyang-si (KR); Seungpyo Hong, Busan (KR)

(73) Assignee: LG Display Co., Ltd., Seoul (KR)

( * ) Notice: Subject to any disclaimer, the term of this patent is extended or adjusted under 35 U.S.C. 154(b) by 503 days.

(21) Appl. No.: 17/898,170

(22) Filed: Aug. 29, 2022

(65) Prior Publication Data

US 2023/0077261 A1    Mar. 9, 2023

(30) Foreign Application Priority Data

Sep. 9, 2021    (KR) .......................... 10-2021-0120205

(51) Int. Cl.
| | | |
|---|---|---|
| *H01L 27/32* | (2006.01) | |
| *H10K 50/82* | (2023.01) | |
| *H10K 59/131* | (2023.01) | |
| *H10K 59/122* | (2023.01) | |

(52) U.S. Cl.
CPC ........... *H10K 59/131* (2023.02); *H10K 50/82* (2023.02); *H10K 59/122* (2023.02)

(58) Field of Classification Search
CPC .... H10K 59/131; H10K 50/82; H10K 59/122; H10K 59/124; H10K 59/8052; H10K 59/1315
See application file for complete search history.

(56) References Cited

U.S. PATENT DOCUMENTS

| | | | |
|---|---|---|---|
| 2016/0043341 A1* | 2/2016 | Heo | .................. H10K 59/1315 438/23 |
| 2017/0317154 A1* | 11/2017 | Heo | ..................... H10K 50/824 |
| 2019/0207168 A1 | 7/2019 | Lee et al. | |
| 2020/0185480 A1 | 6/2020 | Heo | |

(Continued)

FOREIGN PATENT DOCUMENTS

| | | |
|---|---|---|
| KR | 10-2010-0100358 A | 9/2010 |
| KR | 10-2016-0006520 A | 1/2016 |
| KR | 10-2017-0124070 A | 11/2017 |

(Continued)

OTHER PUBLICATIONS

Office Action from the KIPO dated Jul. 2, 2025 issued in counterpart KR Application No. 10-2021-0120205.

*Primary Examiner* — Elmito Breval

(74) *Attorney, Agent, or Firm* — Morgan, Lewis & Bockius LLP

(57) ABSTRACT

A display device is disclosed. The display device includes: a substrate including a plurality of sub-pixels; an auxiliary line disposed between the plurality of sub-pixels on the substrate; an overcoating layer including a base part having an opening that exposes the auxiliary line and a plurality of protrusion parts protruding from the base part; a first electrode corresponding to each of the plurality of sub-pixels and covering the base part and the plurality of protrusion parts; a bank on a part of the first electrode; an organic layer on the first electrode and the bank; and a second electrode on the organic layer and in contact with the auxiliary line exposed through the opening. An end portion of the bank overlaps with the opening.

20 Claims, 9 Drawing Sheets

(56) References Cited

U.S. PATENT DOCUMENTS

2020/0203447 A1* 6/2020 Lee .................... H10K 50/818
2022/0302244 A1* 9/2022 Yuan ................... H10K 59/122

FOREIGN PATENT DOCUMENTS

| KR | 10-2018-0003965 A | 1/2018 |
| KR | 10-2019-0079954 A | 7/2019 |
| KR | 10-2087103 B1 | 3/2020 |

* cited by examiner

DISPLAY DEVICE

CROSS-REFERENCE TO RELATED APPLICATIONS

This application claims the priority of Korean Patent Application No. 10-2021-0120205 filed on Sep. 9, 2021, in the Korean Intellectual Property Office, the disclosure of which is incorporated herein by reference.

BACKGROUND

Technical Field

The present disclosure relates to a display device.

Discussion of the Related Art

With the advent of the information age, display technology for visually displaying electrical information signals is under rapid development. Accordingly, efforts to decrease the volume, weight and power consumption of various display devices have been made.

Among these display devices, a light emitting display device is a self-emitting display device, in which a separate light source is not necessary, which is different from the liquid crystal display device. Therefore, the light emitting display device can be manufactured to be thin and light. Further, the light emitting display device is advantageous not only in power consumption but also in color implementation, a response speed, a viewing angle and a contrast ratio (CR) due to the lower voltage driving. Thus, it is expected to be utilized in various fields.

SUMMARY

Accordingly, embodiments of the present disclosure are directed to a display device that substantially obviates one or more of the problems due to limitations and disadvantages of the related art.

An aspect of the present disclosure is to provide a display device in which light extraction efficiency can be improved.

Another aspect of the present disclosure is to provide a display device capable of improving a luminance difference.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a substrate including a plurality of sub-pixels, and an auxiliary line disposed between the plurality of sub-pixels on the substrate. Also, the display device includes an overcoating layer including a base part having an opening that exposes the auxiliary line and a plurality of protrusion parts protruding from the base part. Further, the display device includes a first electrode corresponding to each of the plurality of sub-pixels and covering the base part and the plurality of protrusion parts. Furthermore, the display device includes a bank on a part of the first electrode, and an organic layer on the first electrode and the bank. Moreover, the display device includes a second electrode on the organic layer and in contact with the auxiliary line exposed through the opening. An end portion of the bank overlaps with the opening.

In another aspect, the display device comprises a substrate including a plurality of sub-pixels, and an auxiliary line disposed between the plurality of sub-pixels on the substrate. Also, the display device includes an overcoating layer including a base part having an opening that exposes the auxiliary line and a plurality of protrusion parts. Further, the display device includes a first electrode covering the base part and the plurality of protrusion parts. Furthermore, the display device includes a bank on a part of the first electrode and made of an inorganic material. Moreover, the display device includes an organic layer on the first electrode and the bank, and a second electrode on the organic layer and electrically connected to the auxiliary line. An end portion of the bank is disposed to cover the opening while being spaced apart from the auxiliary line.

Other detailed matters of the exemplary embodiments are included in the detailed description and the drawings.

According to the present disclosure, it is possible to improve light extraction efficiency of a display device by using a side mirror type anode.

According to the present disclosure, it is possible to improve luminance uniformity through a contact between a cathode and an auxiliary line.

It is to be understood that both the foregoing general description and the following detailed description are exemplary and explanatory and are intended to provide further explanation of the inventive concepts as claimed.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
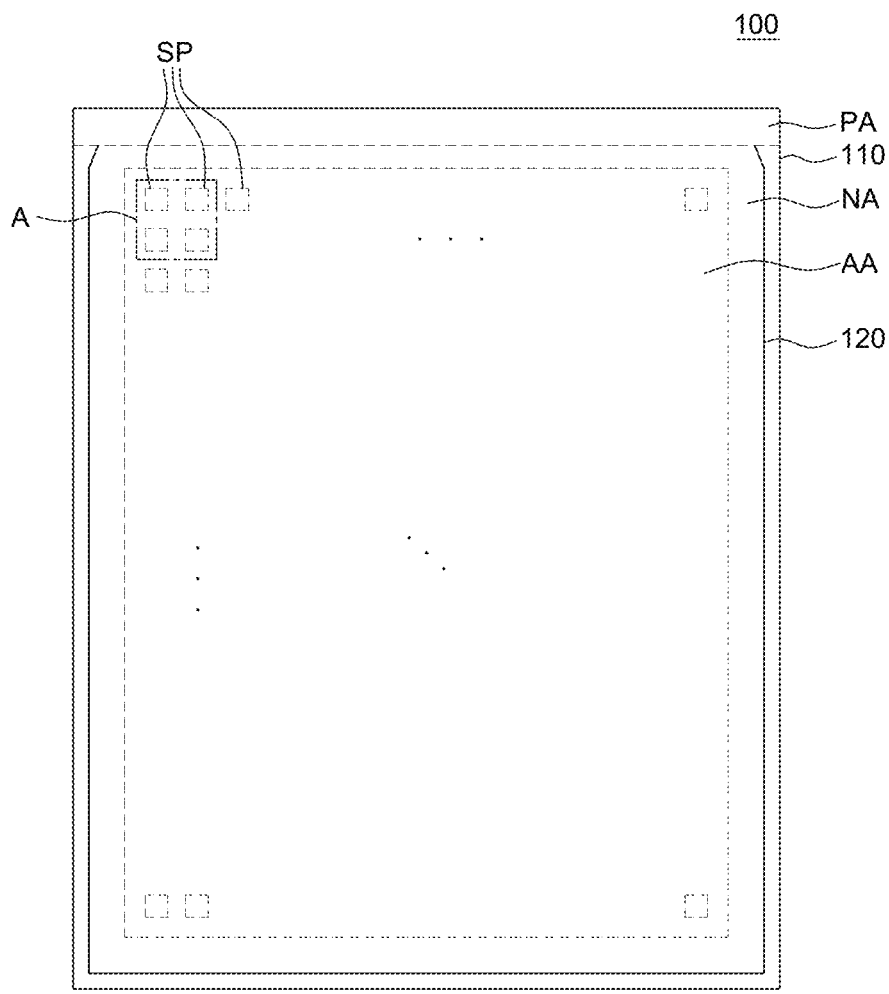
FIG. 1 is a plan view illustrating a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

FIG. 1 is a plan view illustrating a display device according to an exemplary embodiment of the present disclosure.

Referring to FIG. 1, a display device 100 according to an exemplary embodiment of the present disclosure includes a display area AA and a non-display area NA.

The display area AA is provided in a middle part of a substrate 110 and may be defined as an area for displaying an image in the display device 100. A display element and various driving elements for driving the display element may be disposed in the display area AA. For example, the display element may be configured by a light emitting diode 150 including a first electrode 151, an organic layer 152 and a second electrode 153 which will be described later. Further, various driving elements for driving the display element, such as a thin film transistor 130 (described later), a capacitor or a wiring line, may be disposed in the display area AA.

A plurality of sub-pixels SP may be included in the display area AA. The sub-pixel SP is a minimum unit that configures a screen, and each of the plurality of sub-pixels SP may include a light emitting diode 150 and a driving circuit. The plurality of sub-pixels SP may be defined by intersection of a plurality of gate lines disposed in a first direction and a plurality of data lines disposed in a second direction different from the first direction. Herein, the first direction may be a horizontal direction in FIG. 1 and the second direction may be a vertical direction in FIG. 1, but are not limited thereto. The plurality of sub-pixels SP may emit light having different wavelengths. For example, the plurality of sub-pixels SP may include a red sub-pixel, a green sub-pixel and a blue sub-pixel. The plurality of sub-pixels SP may also include a white sub-pixel.

A driving circuit of each sub-pixel SP is a circuit configured to control driving of the light emitting diode 150. For example, the driving circuit may include a switching transistor, a driving transistor and a capacitor. The driving circuit may be electrically connected to signal lines such as a gate line and a data line which are connected to a gate driver and a data driver disposed in the non-display area NA.

The non-display area NA is provided in a circumferential area of the substrate 110 and may be defined as an area where no image is displayed. The non-display area NA may be disposed to surround the display area AA, but is not limited thereto. Various components for driving the plurality of sub-pixels SP disposed in the display area AA may be disposed in the non-display area NA. For example, a driving IC, a driving circuit, a signal line and a flexible film which supply a signal for driving the plurality of sub-pixels SP may be disposed. In this case, the driving IC may include a gate driver and a data driver.

The non-display area NA includes a pad area PA. For example, the pad area PA may be disposed at an upper end portion of the substrate 110, but is not limited thereto. The pad area PA may include a plurality of pads and a signal line connected to the plurality of pads. In the pad area PA, the driving IC, the driving circuit or the flexible film may be connected through the plurality of pads. The driving IC, the driving circuit or the flexible film may transfer various driving signals to the plurality of pads. Also, the plurality of pads may receive various driving signals for driving the display device 100 and supply them to the components, such as the plurality of sub-pixels SP, of the display device 100 to drive the display device 100. For example, the plurality of pads may include a data pad for supplying a data signal to each of the plurality of sub-pixels SP. Also, the plurality of pads may include a low-potential power supply pad for supplying a low-potential voltage VSS to the second electrode 153 of the light emitting diode 150.

A low-potential power supply line 120 may be disposed in the non-display area NA. The low-potential power supply line 120 may be disposed along the circumference of the substrate 110. The low-potential power supply line 120 may be electrically connected to the low-potential power supply pad disposed in the pad area PA. In this case, the low-potential power supply pad may be disposed on both ends of the pad area PA, but is not limited thereto. The low-potential power supply line 120 may be electrically connected to the second electrode 153 of the light emitting diode 150 through an auxiliary line 121. The low-potential power supply line 120 may supply the low-potential voltage VSS to the second electrode 153. This will be described later with reference to FIG. 4.

Figure 2:
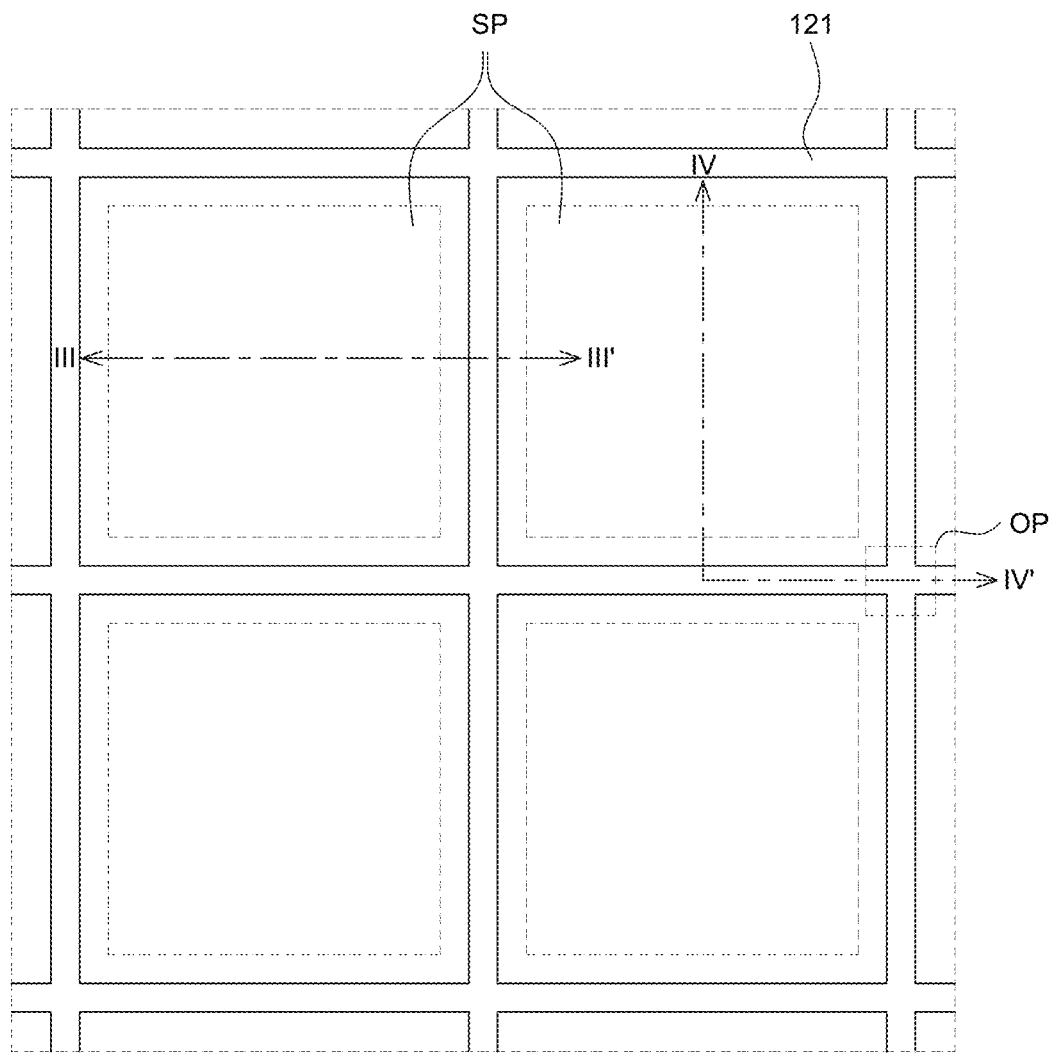
FIG. 2 is an enlarged plan view showing a portion A of FIG. 1.

FIG. 2 is an enlarged plan view showing a portion A of FIG. 1.

Referring to FIG. 2, the auxiliary line 121 is disposed between the plurality of sub-pixels SP. The auxiliary line 121 may be formed in a mesh structure on the substrate 110. The auxiliary line 121 may be a line extending into to the display area AA from the low-potential power supply line 120 disposed in the non-display area NA. The low-potential power supply line 120 and the second electrode 153 may be electrically connected to each other through the auxiliary line 121. The auxiliary line 121 is illustrated as being disposed to surround each of the plurality of sub-pixels SP, but is not limited thereto. For example, the auxiliary line 121 may be formed in a mesh structure surrounding several sub-pixels SP.

An opening OP that exposes the auxiliary line 121 may be formed on a part of the auxiliary line 121. In this case, the opening OP may be formed at a part of a region between the plurality of sub-pixels SP. The auxiliary line 121 and the second electrode 153 may be connected at the opening OP. Although it is illustrated that each opening OP is provided corresponding to four sub-pixels SP, the present disclosure is not limited thereto. For example, the opening OP may be provided corresponding to each of the plurality of sub-pixels SP. Also, the position of the opening OP is not limited to the illustrated example and may vary depending on the design as long as it can connect the second electrode 153 and the auxiliary line 121. The opening OP will be described in more detail with reference to FIG. 4.

The low-potential power supply pad and the low-potential power supply line 120 may supply the low-potential voltage VSS to the second electrode 153 through the auxiliary line 121. In this case, the low-potential power supply line 120 and the auxiliary line 121 may be made of a material having a low electrical resistance and a high conductivity. Accordingly, the low-potential power supply line 120 and the auxiliary line 121 can reduce a resistance of the second electrode 153 which may increase due to a small thickness of the second electrode 153.

Figure 3:
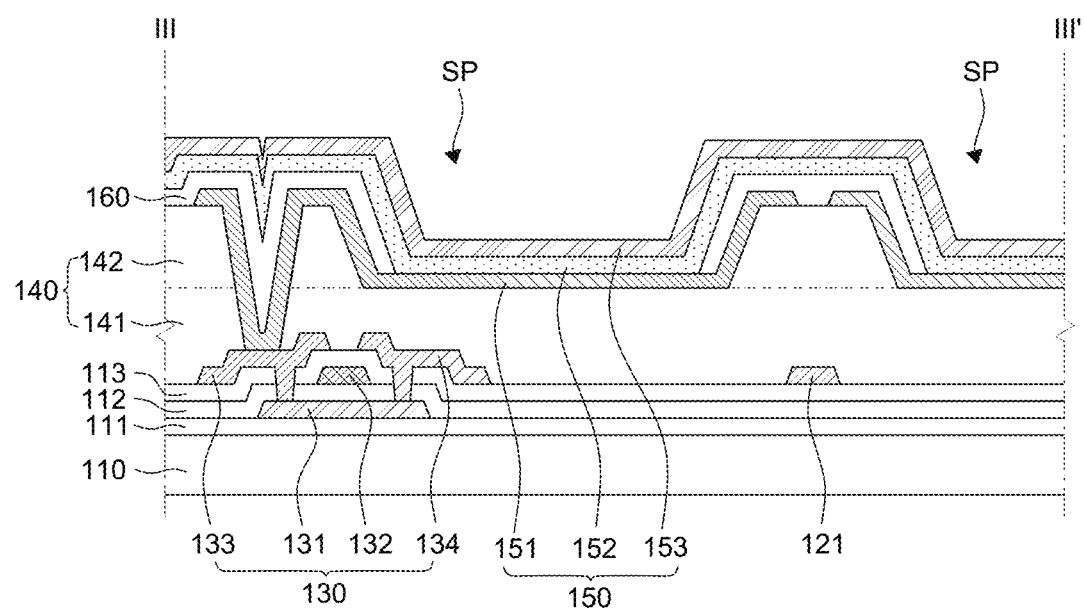
FIG. 3 is a cross-sectional view of the display device as taken along a line III-III' of FIG. 2.

FIG. 3 is a cross-sectional view of the display device as taken along a line III-III' of FIG. 2.

Referring to FIG. 3, the display device 100 includes the substrate 110, the auxiliary line 121, the transistor 130, an overcoating layer 140, the light emitting diode 150 and a bank 160. The display device 100 may be implemented as a top emission type display device, but is not limited thereto.

The substrate 110 supports and protects various components of the display device 100. The substrate 110 may be made of glass or a plastic material having flexibility. If the substrate 110 is made of a plastic material, it may be made of, for example, polyimide (PI), but is not limited thereto.

A buffer layer 111 may be disposed on the substrate 110. The buffer layer 111 may serve to enhance an adhesive force between layers formed on the buffer layer 111 and the substrate 110 and block alkali components or the like flowing out from the substrate 110. The buffer layer 111 may be formed as a single layer of silicon nitride (SiNx) or silicon oxide (SiOx), or a multilayer of silicon nitride (SiNx) or silicon oxide (SiOx), but is not limited thereto. The buffer layer 111 is not an essential component and may be omitted depending on the type and material of the substrate 110, the structure and type of the transistor 130, etc.

The transistor 130 is disposed on the buffer layer 111. The transistor 130 may be used as a driving element for driving the light emitting diode 150 in the display area AA. The transistor 130 includes an active layer 131, a gate electrode 132, a source electrode 133 and a drain electrode 134. The transistor 130 illustrated in FIG. 3 is a driving transistor and is a top gate type thin film transistor in which the gate electrode 132 is disposed on the active layer 131, but is not limited thereto. The transistor 130 may also be implemented as a bottom gate type transistor.

The active layer 131 is disposed on the buffer layer 111. When the transistor 130 is driven, a channel is formed in the active layer 131. The active layer 131 may be made of an oxide semiconductor or amorphous silicon (a-Si), polycrystalline silicon (poly-Si) or an organic semiconductor, etc.

A gate insulating layer 112 is disposed on the active layer 131. The gate insulating layer 112 is a layer for electrically insulating the gate electrode 132 from the active layer 131, and may be made of an insulating material. For example, the gate insulating layer 112 may be formed as a single layer of silicon nitride (SiNx) or silicon oxide (SiOx) that is an inorganic material, or a multilayer of silicon nitride (SiNx) or silicon oxide (SiOx), but it is not limited thereto.

In the gate insulating layer 112, contact holes through which the source electrode 133 and the drain electrode 134 are in contact with a source region and a drain region, respectively, of the active layer 131 are formed. The gate insulating layer 112 may be formed on the entire surface of the substrate 110 as illustrated in FIG. 3 or be patterned to have the same width as the gate electrode 132, but is not limited thereto.

The gate electrode 132 is disposed on the gate insulating layer 112. The gate electrode 132 is disposed on the gate insulating layer 112 so as to overlap with a channel region of the active layer 131. The gate electrode 132 may be one of various metal materials, for example, molybdenum (Mo), aluminum (Al), chromium (Cr), gold (Au), titanium (Ti), nickel (Ni), neodymium (Nd) and copper (Cu) or an alloy of two or more of them, or a multilayer thereof, but it is not limited thereto.

An interlayer insulating layer 113 is disposed on the gate electrode 132. The interlayer insulating layer 113 may be formed as a single layer of silicon nitride (SiNx) or silicon oxide (SiOx) that is an inorganic material, or a multilayer of silicon nitride (SiNx) or silicon oxide (SiOx), but it is not limited thereto. In the interlayer insulating layer 113, contact holes through which the source electrode 133 and the drain electrode 134 are in contact with the source region and the drain region, respectively, of the active layer 131 are formed.

The source electrode 133 and the drain electrode 134 are disposed on the interlayer insulating layer 113. The source electrode 133 and the drain electrode 134 are disposed on the same layer to be spaced apart from each other. The source electrode 133 and the drain electrode 134 are electrically connected to the active layer 131 through the contact holes in the gate insulating layer 112 and the interlayer insulating layer 113. The source electrode 133 and the drain electrode 134 may be one of various metal materials, for example, molybdenum (Mo), aluminum (Al), chromium (Cr), gold (Au), titanium (Ti), nickel (Ni), neodymium (Nd) and copper (Cu) or an alloy of two or more of them, or a multilayer thereof, but it is not limited thereto.

In FIG. 3, only the driving transistor 130 among various transistors included in the display device 100 is illustrated, but other transistors such as a switching transistor may also be disposed.

The auxiliary line 121 may be disposed between the plurality of sub-pixels SP on the interlayer insulating layer 113. The auxiliary line 121 may be a line extending into to the display area AA from the low-potential power supply line 120. The auxiliary line 121 may be formed in a mesh structure within the display area AA. The auxiliary line 121 may be made of the same material by the same process as the source electrode 133 and the drain electrode 134, but is not limited thereto. Also, the auxiliary line 121 may be disposed under the interlayer insulating layer 113 if necessary.

The overcoating layer 140 is disposed on the interlayer insulating layer 113, the auxiliary line 121 and the transistor 130. The overcoating layer 140 is an insulating layer that protects the transistor 130 and planarizes an upper portion of the transistor 130. In the overcoating layer 140, a contact hole that exposes the source electrode 133 of the transistor 130 is formed. Although it is illustrated in FIG. 3 that a contact hole that exposes the source electrode 133 is formed in the overcoating layer 140, the present disclosure is not limited thereto. For example, a contact hole that exposes the drain electrode 134 may be formed in the overcoating layer 140.

The overcoating layer 140 may be made of one of acrylic-based resin, epoxy resin, phenol resin, polyamide-based resin, polyimide-based resin, unsaturated polyester-based resin, polyphenylene-based resin, polyphenylene sulfide-based resin, benzocyclobutene and photoresist, but is not limited thereto.

Meanwhile, a passivation layer covering the interlayer insulating layer 113, the auxiliary line 121 and the transistor 130 may be further disposed under the overcoating layer 140. The passivation layer may be formed as a single layer of silicon nitride (SiNx) or silicon oxide (SiOx), or a multilayer of silicon nitride (SiNx) or silicon oxide (SiOx), but is not limited thereto.

The overcoating layer 140 includes a first base part 141, a second base part 143 (shown in FIG. 4) and a plurality of protrusion parts 142. The first base part 141, the second base part 143 and the plurality of protrusion parts 142 may be made of the same material. The first base part 141, the second base part 143 and the plurality of protrusion parts 142 may be formed by the same process, but are not limited thereto. For example, the first base part 141, the second base part 143 and the plurality of protrusion parts 142 may also be formed by separate processes, respectively. Alternatively, some of the first base part 141, the second base part 143 and the plurality of protrusion parts 142 may be formed by the same process and the other may be formed by a separate process. The first base part 141, the second base part 143 and the plurality of protrusion parts 142 may be formed by, for example, a mask process, but are not limited thereto.

The first base part 141 is disposed to cover the interlayer insulating layer 113, the auxiliary line 121 and the transistor 130. An upper surface of the first base part 141 has a surface parallel to the substrate 110. Therefore, a step generated due to components disposed under the first base part 141 can be planarized by the first base part 141.

The plurality of protrusion parts 142 is disposed on the first base part 141. The plurality of protrusion parts 142 may be disposed between the plurality of sub-pixels SP. The plurality of protrusion parts 142 protrudes from the first base part 141. The plurality of protrusion parts 142 may have an upper surface smaller than a lower surface, but is not limited thereto.

Each of the plurality of protrusion parts 142 has an upper surface and a side surface. The upper surface of the protrusion part 142 is a surface disposed on an uppermost portion of the protrusion part 142 and may be a surface substantially parallel to the first base part 141 or the substrate 110. The side surface of the protrusion part 142 may be a surface that connects the upper surface of the protrusion part 142 and the first base part 141. The side surface of the protrusion part 142 may have a shape inclined toward the first base part 141 from the upper surface thereof.

The second base part 143 may extend from the first base part 141 and may have a lower height than the first base part 141. The second base part 143 will be described in more detail with reference to FIG. 4.

The light emitting diode 150 is disposed on the overcoating layer 140. The light emitting diode 150 includes the first electrode 151 electrically connected to the source electrode 133 of the transistor 130, the organic layer 152 on the first electrode 151 and the second electrode 153 on the organic layer 152.

The first electrode 151 is disposed corresponding each of the plurality of sub-pixels SP. The first electrode 151 is disposed to cover the first base part 141 and the plurality of protrusion parts 142. Specifically, the first electrode 151 may be disposed on the upper surface of the first base part 141 on which the protrusion part 142 is not disposed, and the side surfaces of the plurality of protrusion parts 142. That is, the first electrode 151 is disposed along the shape of the first base part 141 and the protrusion part 142. Also, the first electrode 151 may be formed on a part of the upper surfaces of the plurality of protrusion parts 142.

The first electrode 151 can be an anode of the light emitting diode 150. The first electrode 151 may be electrically connected to the source electrode 133 of the transistor 130 through the contact hole formed in the overcoating layer 140. However, the first electrode 151 may be configured to be electrically connected to the drain electrode 134 of the transistor 130 depending on the type of the transistor 130 and a design method of the driving circuit.

Although FIG. 3 illustrates that the first electrode 151 is a single layer, the first electrode 151 may be configured as a multilayer. For example, the first electrode 151 may include a reflective layer that reflects light emitted from the organic layer 152 toward the second electrode 153 and a transparent conductive layer that supplies holes to the organic layer 152.

The reflective layer is disposed on the overcoating layer 140 to reflect light emitted from the light emitting diode 150 upwards. Light generated in the organic layer 152 of the light emitting diode 150 can be emitted not only upwards, but also laterally. The light emitted laterally may be directed to the inside of the display device 100 and trapped inside the display device 100 due to total reflection, or may travel to a direction of the inside of the display device 100 and then disappear. Therefore, the reflective layer is disposed under the organic layer 152 to cover a side portion of the plurality of protrusion parts 142. Thus, a traveling direction of the light traveling toward a side portion of the organic layer 152 cab be changed to a front direction.

The reflective layer may be made of a metal material, for example, aluminum (Al), silver (Ag), copper (Cu) and a magnesium-silver alloy (Mg:Ag), but is not limited thereto.

The transparent conductive layer is disposed on the reflective layer. The transparent conductive layer may be made of a conductive material having a high work function to supply holes to the organic layer 152. For example, the transparent conductive layer may be made of transparent conductive oxide such as indium tin oxide (ITO), indium zinc oxide (IZO), indium tin zinc oxide (ITZO), zinc oxide (ZnO) and tin oxide (TO), but is not limited thereto.

The bank 160 is disposed on the overcoating layer 140 and the first electrode 151. The bank 160 may cover a part of the first electrode 151 and define an emission area and a non-emission area. The emission area may refer to an area where light is substantially generated by the organic layer 152 in each of the plurality of sub-pixels SP. In the emission area, the bank 160 is not disposed, and the organic layer 152 is disposed directly on the first electrode 151 and generates light. The non-emission area may refer to an area where light is not generated. However, the non-emission area may include a light reflective area that does not generate light, but reflects light to be extracted to the front direction. The light reflective area may correspond to the inclined side surface of the protrusion part 142. In the light reflective area, light emitted laterally from the light emitting diode 150 can be extracted to the front direction by the first electrode 151 disposed along the inclined surface of the protrusion part 142.

Meanwhile, the first electrode 151 may be divided into a first area, a second area and a third area according to the emission area, the non-emission area and the light reflective area. For example, the first area of the first electrode 151 may correspond to the emission area and contribute to light emission. The second area of the first electrode 151 may be disposed along the inclined surface of the protrusion part 142 and may contribute to light reflection. The third area of the first electrode 151 may be disposed on the upper surface of the protrusion part 142. The first area, the second area and the third area of the first electrode 151 may be deposited as a single component by the same process.

The bank 160 may be made of an inorganic material. For example, the bank 160 may be formed as a single layer of silicon nitride (SiNx) or silicon oxide (SiOx), or a multilayer of silicon nitride (SiNx) or silicon oxide (SiOx).

The organic layer 152 is disposed on the first electrode 151 and the bank 160. For example, the organic layer 152 is disposed on the first electrode 151 in the emission area and on the bank 160 in the non-emission area. The organic layer 152 may be disposed along the shape of the first electrode 151 and the bank 160. The organic layer 152 includes a light emitting layer and a common layer.

The light emitting layer is an organic layer for emitting light of a specific color. Different light emitting layers may be disposed in the plurality of sub-pixels SP, respectively, or the same light emitting layer may be disposed in all of the plurality of sub-pixels SP. For example, if different light emitting layers are disposed in the plurality of sub-pixels SP, respectively, a red light emitting layer may be disposed in a red sub-pixel, a green light emitting layer may be disposed in a green sub-pixel and a blue light emitting layer may be disposed in a blue sub-pixel. If the same light emitting layer is disposed in all of the plurality of sub-pixels SP, light from the light emitting layer may be converted into light of various colors through a separate light conversion layer or color filter.

The common layer is an organic layer disposed to improve luminous efficiency of the light emitting layer. The common layer may be formed as a single layer throughout the plurality of sub-pixels SP. That is, the common layers of the plurality of respective sub-pixels SP may be made of the same material by the same process at the same time. The common layer may include a hole injection layer, a hole transport layer, an electron transport layer, an electron injection layer and a charge generation layer, but is not limited thereto.

Figure 4:
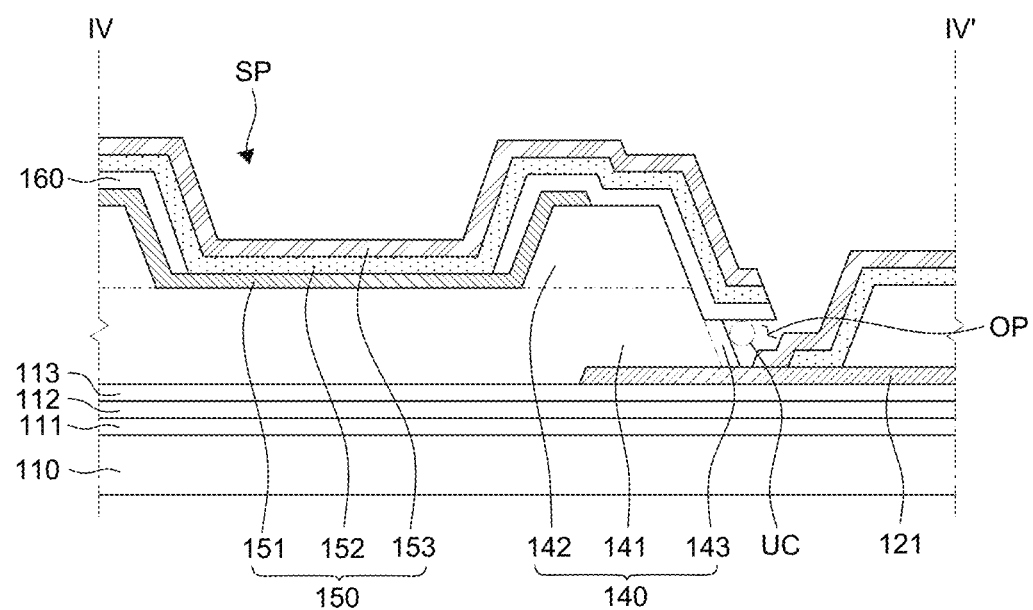
FIG. 4 is a cross-sectional view of the display device as taken along a line IV-IV' of FIG. 2.

The second electrode 153 is disposed on the organic layer 152. The second electrode 153 may be disposed along the shape of the organic layer 152. Since the second electrode 153 supplies electrons to the organic layer 152, it may be made of a conductive material having a low work function. The second electrode 153 can be a cathode of the light emitting diode 150. The second electrode 153 may be made of a transparent conductive material such as indium tin oxide (ITO) and indium zinc oxide (IZO) or may be made of a metal alloy, such as MgAg, or an ytterbium (Yb) alloy. The second electrode 153 may further include a metal doping layer, but is not limited thereto. As illustrated in FIG. 4, the second electrode 153 may be connected to the auxiliary line 121 and supplied with a low-potential voltage through the low-potential power supply line 120.

Meanwhile, although not illustrated in the drawings, an encapsulation unit may be formed on the light emitting diode 150. The encapsulation unit protects the light emitting diode 150 vulnerable to moisture so as not to be exposed to moisture. The encapsulation unit can block oxygen and moisture that permeate into the display device 100 from the outside. The encapsulation unit may have a structure in which inorganic layers and organic layers are alternately laminated, but is not limited thereto.

FIG. 4 is a cross-sectional view of the display device as taken along a line IV-IV' of FIG. 2.

Referring to FIG. 4, the overcoating layer 140 includes the first base part 141, the second base part 143 and the plurality of protrusion parts 142. Herein, the base parts 141 and 143 include the opening OP that exposes the auxiliary line 121. The organic layer 152 and the second electrode 153 may be cut off in a region corresponding to the opening OP.

The second base part 143 extends from an end portion of the first base part 141. The second base part 143 may have a lower height than the first base part 141. That is, an upper surface of the second base part 143 may be disposed lower than the upper surface of the first base part 141. The second base part 143 may be directly adjacent to the opening OP. That is, the second base part 143 may be disposed between the first base part 141 and the opening OP. A side surface of the second base part 143 may be exposed through the opening OP.

The opening OP may be formed in the non-emission area between the plurality of sub-pixels SP. The opening OP may be defined as a region where the base parts 141 and 143 are not formed and the auxiliary line 121 is exposed by the base parts 141 and 143. The opening OP may be formed by etching a part of the second base part 143 using the bank 160 as a mask. The opening OP may include an under-cut region UC which will be described later with reference to FIG. 5C. The under-cut region UC may refer to an empty space under the bank 160 where the base parts 141 and 143 are not disposed. The under-cut region UC may be formed by etching a material of the second base part 143 under the bank 160. That is, the opening OP may be formed so that an outer side surface of the second base part 143 is disposed inner than the end of the bank 160. Accordingly, the organic layer 152 and the second electrode 153 may be disconnected at the region corresponding to the opening OP.

An end portion of the bank 160 may overlap with the opening OP. In other words, the bank 160 may protrude from the upper surface of the second base part 143 so as to cover the opening OP. Specifically, the bank 160 may extend from the plurality of protrusion parts 142 to the upper surface of the second base part 143, and the opening OP may be formed by etching a part of the second base part 143 using the bank 160 as a mask. Therefore, the bank 160 is not disposed inside the opening OP, but may overlap with the opening OP outside the opening OP.

The bank 160 may be made of an inorganic material, and the base parts 141 and 143 may be made of an organic material. Accordingly, when the second base part 143 is etched, the bank 160 is not removed, but only the second base part 143 can be easily removed. In particular, the second base part 143 may be etched by dry etching using oxygen ($O_2$). Therefore, only the organic material forming the second base part 143 may be selectively etched to form the opening OP. In this case, an inner side surface of the opening OP may be disposed inner than the ends of the bank 160, the organic layer 152 and the second electrode 153. That is, the under-cut region UC may be formed under the bank 160. A lower surface of the bank 160 may be exposed through the opening OP due to the under-cut region UC.

The bank 160 protrudes further than the inner side surface of the opening OP so as to overlap with the opening OP. Thus, the organic layer 152 and the second electrode 153 disposed on the bank 160 may be cut off from each other. That is, it may be difficult to deposit the organic layer 152 and the second electrode 153 in the under-cut region UC under the bank 160 due to a shadow effect. Therefore, the organic layer 152 disposed on each of one side and the other side of the region corresponding to the opening OP may be discontinuously formed. Also, the second electrode 153 disposed on each of one side and the other side of the region corresponding to the opening OP may be discontinuously formed.

Specifically, in the region corresponding to the opening OP, the organic layer 152 disposed in the sub-pixel SP on one side of the opening OP extends to the end of the bank 160. That is, an end portion of the organic layer 152 in contact with the bank 160 may overlap with the opening OP. Also, in the region corresponding to the opening OP, the organic layer 152 disposed in the non-emission area on the other side of the opening OP extends from the upper surface of the first base part 141 to a part of the auxiliary line 121. Further, the organic layer 152 is not disposed on the auxiliary line 121 corresponding to the under-cut region UC. That is, the organic layer 152 on each of one side and the other side of the opening OP may be discontinuously formed. Accordingly, a part of the auxiliary line 121 within the opening OP may be exposed by the organic layer 152.

Meanwhile, FIG. 4 illustrates the organic layer 152 on the other side of the opening OP is disposed on the first base part 141. However, the present disclosure is not limited thereto. That is, the plurality of protrusion parts 142 or the bank 160 as well as the first base part 141 may be further disposed in the non-emission area on the other side of the opening OP.

In the region corresponding to the opening OP, the second electrode 153 disposed in the sub-pixel SP on one side of the opening OP extends to the end of the bank 160. That is, an end portion of the second electrode 153 in contact with the organic layer 152 may overlap with the opening OP. Also, in the region corresponding to the opening OP, the second electrode 153 disposed in the non-emission area on the other side of the opening OP extends to cover the organic layer 152 and to be in contact with the auxiliary line 121. That is, within the opening OP, the second electrode 153 extends to an upper surface of the auxiliary line 121 while covering the end portion of the organic layer 152. The second electrode 153 on each of one side and the other side of the opening OP may be discontinuously formed. Further, the second electrode 153 may be electrically connected to the auxiliary line 121 exposed by the organic layer 152 in the opening OP. In this case, the end portion of the second electrode 153 within the opening OP may overlap with the bank 160. That is, the second electrode 153 may also be formed on a part of the auxiliary line 121 covered by the bank 160.

The organic layer 152 may be formed by a deposition process, such as evaporation, with linearity. Also, the second electrode 153 may be formed by a deposition process, such as sputtering, with non-uniform directionality. Accordingly, the organic layer 152 is not formed under the bank 160, whereas the second electrode 153 is formed extending to a region under the bank 160. Therefore, the second electrode 153 can be easily brought into contact with the auxiliary line 121 in the opening OP. Accordingly, it is possible to reduce a resistance of the second electrode 153 and improve luminance uniformity of the display device 100.

In general, the low-potential power supply line 120 is disposed in the outermost area of the substrate 110 along the circumference of the substrate 110. The low-potential power supply line 120 may be applied with the low-potential voltage VSS from the driving circuit connected to the low-potential power supply pad disposed in the pad area PA of the substrate 110. The low-potential power supply line 120 may apply the low-potential voltage VSS to the second electrode 153 through the auxiliary line 121. In this case, the second electrode 153 may be disposed as a single layer commonly corresponding to the plurality of sub-pixels SP of the display device 100. Also, the second electrode 153 is made of a transparent conductive material to increase a transmittance ratio and thus may have a high sheet resistance. Therefore, the second electrode 153 may have a non-uniform voltage in the entire surface. That is, there may be a voltage difference between a portion of the second electrode 153 to which the low-potential voltage VSS is applied and a portion away therefrom. Also, such a voltage drop (IR drop) may cause a luminance difference between an outer portion of the display area AA and a central portion of the display area AA. In particular, as the display device 100 increases in size, the voltage drop may also increase.

Accordingly, the display device 100 of the present disclosure includes the auxiliary line 121 formed in a mesh structure in the display area AA. The auxiliary line 121 may be disposed between the plurality of sub-pixels SP. The auxiliary line 121 may electrically connect the low-potential power supply line 120 and the second electrode 153. Since the auxiliary line 121 can reduce the overall resistance of the second electrode 153, the voltage drop can be improved. Also, the display quality of the display device 100 can be improved by suppressing luminance non-uniformity of the display area AA.

In the display device 100 of the present disclosure, the bank 160 may be made of an inorganic material and the overcoating layer 140 may be made of an organic material. Therefore, when a part of the second base part 143 is etched using the bank 160 as a mask, only the second base part 143 can be easily removed. Also, since the bank 160 is used as a mask, the second base part 143 can be etched so that the under-cut region UC is formed under the bank 160. Therefore, when the organic layer 152 is deposited, the organic layer 152 may have a disconnection structure in the opening OP. That is, the organic layer 152 is not formed under the bank 160, and, thus, the auxiliary line 121 may be exposed by the organic layer 152 within the opening OP. Therefore, the auxiliary line 121 exposed by the organic layer 152 can be easily brought into contact with the second electrode 153.

The base parts 141 and 143 of the overcoating layer 140 include the first base part 141 and the second base part 143 having a smaller thickness than the first base part 141. Specifically, the upper surface of the second base part 143 may be disposed lower than the upper surface of the first base part 141. Therefore, it is possible to minimize a contact area between the organic layer 152 and the auxiliary line 121 in the opening OP.

Specifically, if the under-cut region UC is formed under the bank 160 only with the first base part 141 without the second base part 143, the organic layer 152 may extend to a part of the auxiliary line 121 overlapping with the bank 160. That is, the height of the under-cut region UC, which is the distance between the bank 160 and the auxiliary line 121, increases. Thus, a shadow effect of the bank 160 may decrease and the organic layer 152 may also be deposited on a part of the auxiliary line 121 covered by the bank 160. However, according to the present disclosure, due to the second base part 143 having a lower height, the height of the under-cut region UC may decrease and a shadow effect of the bank 160 may be maximized. Therefore, it is possible to minimize deposition of the organic layer 152 on the auxiliary line 121 overlapping with the bank 160. As a result, a contact area between the organic layer 152 and the auxiliary line 121 may be minimized. Thus, an exposed area of the auxiliary line 121 exposed by the organic layer 152 may increase. Also, a contact area between the second electrode 153 and the auxiliary line 121 may increase. Therefore, it is possible to more effectively reduce a resistance of the second electrode 153 and possible to improve luminance uniformity.

FIG. 5A through FIG. 5E are cross-sectional views sequentially illustrating a method of manufacturing a display device according to an exemplary embodiment of the present disclosure.

Figure 5A:
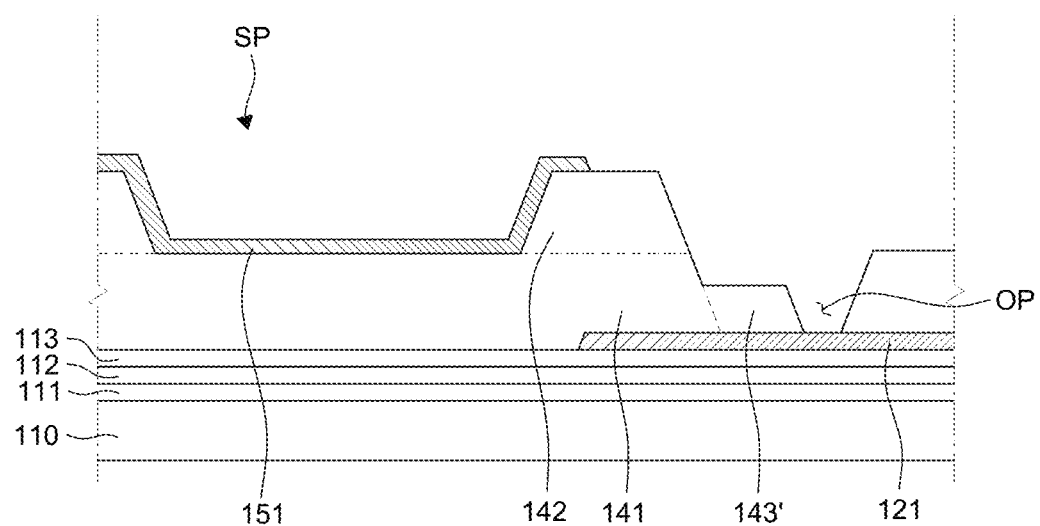
FIG. 5A through FIG. 5E are cross-sectional views sequentially illustrating a method of manufacturing a display device according to an exemplary embodiment of the present disclosure.

Referring to FIG. 5A, the buffer layer 111, the transistor 130 (not shown), the gate insulating layer 112, the interlayer insulating layer 113, the auxiliary line 121, the overcoating layer, and the first electrode 151 are formed on the substrate 110.

The overcoating layer may include the first base part 141, the plurality of protrusion parts 142 protruding from the upper surface of the first base part 141 and an extension part 143' extending from the end portion of the first base part 141. The base part 141 may correspond to a region where the light emitting diode 150 is to be disposed in each of the plurality of sub-pixels SP. The plurality of protrusion parts 142 may correspond to the non-emission area between the light emitting diodes 150. The extension part 143' is to be etched by the bank 160 to form the second base part 143. An upper surface of the extension part 143' may be disposed lower than the upper surface of the first base part 141.

The overcoating layer may be formed by a mask process. For example, the first base part 141, the plurality of protrusion parts 142 and the extension part 143' may be formed to have different heights by using a half-tone mask. The overcoating layer may be made of an organic material. Specifically, the overcoating layer may be made of one of acrylic-based resin, epoxy resin, phenol resin, polyamide-based resin, polyimide-based resin, unsaturated polyester-based resin, polyphenylene-based resin, polyphenylene sulfide-based resin, benzocyclobutene and photoresist, but is not limited thereto.

The auxiliary line 121 may be exposed by the overcoating layer. Specifically, the opening OP that exposes the auxiliary line 121 may be formed between the first base part 141 and the extension part 143'. The auxiliary line 121 exposed through the opening OP may be in contact with the second electrode 153 to be formed later. Herein, the opening OP may be defined as a region where the overcoating layer is not formed and the auxiliary line 121 is exposed by the overcoating layer.

The first electrode 151 is disposed on a part of the overcoating layer. The first electrode 151 may be patterned corresponding to each of the plurality of sub-pixels SP. That is, the first electrodes 151 disposed in the plurality of respective sub-pixels SP may be spaced apart from each other. The first electrode 151 may be disposed to cover the first base part 141 and the plurality of protrusion parts 142. In particular, the first electrode 151 may be disposed to cover the side surfaces of the plurality of protrusion parts 142 extending from the upper surface of the base part 141. Accordingly, a traveling direction of light emitted laterally from the light emitting diode 150 is changed to a front direction, and, thus, light extraction efficiency can be improved.

The first electrode 151 may include a reflective layer and a transparent conductive layer. The reflective layer may be made of a metal material, for example, aluminum (Al), silver (Ag), copper (Cu) and a magnesium-silver alloy (Mg:Ag), but is not limited thereto. The transparent conductive layer may be made of transparent conductive oxide such as indium tin oxide (ITO), indium zinc oxide (IZO), indium tin zinc oxide (ITZO), zinc oxide (ZnO) and tin oxide (TO), but is not limited thereto.

Figure 5B:
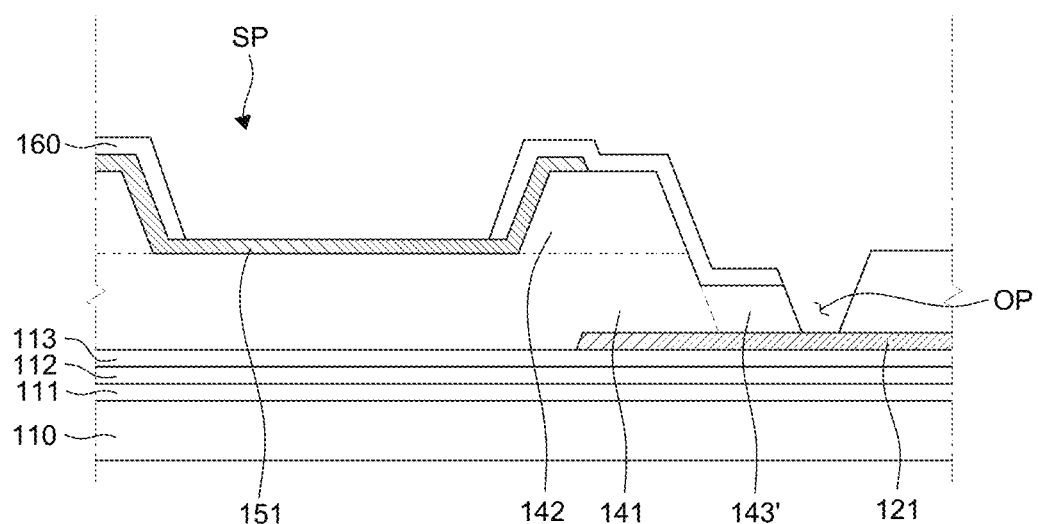

Referring to FIG. 5B, the bank 160 is disposed on a part of the first electrode 151. The bank 160 may be disposed to expose the first electrode 151 disposed on the upper surface of the first base part 141. The bank 160 may be disposed from the first electrode 151 so as to cover the plurality of protrusion parts 142 and the extension part 143'. However, the bank 160 is not disposed in the opening OP. That is, the bank 160 may be disposed only to the upper surface of the extension part 143'.

The bank 160 may be made of an inorganic material. For example, the bank 160 may be formed as a single layer of silicon nitride (SiNx) or silicon oxide (SiOx), or a multilayer of silicon nitride (SiNx) or silicon oxide (SiOx).

Figure 5C:
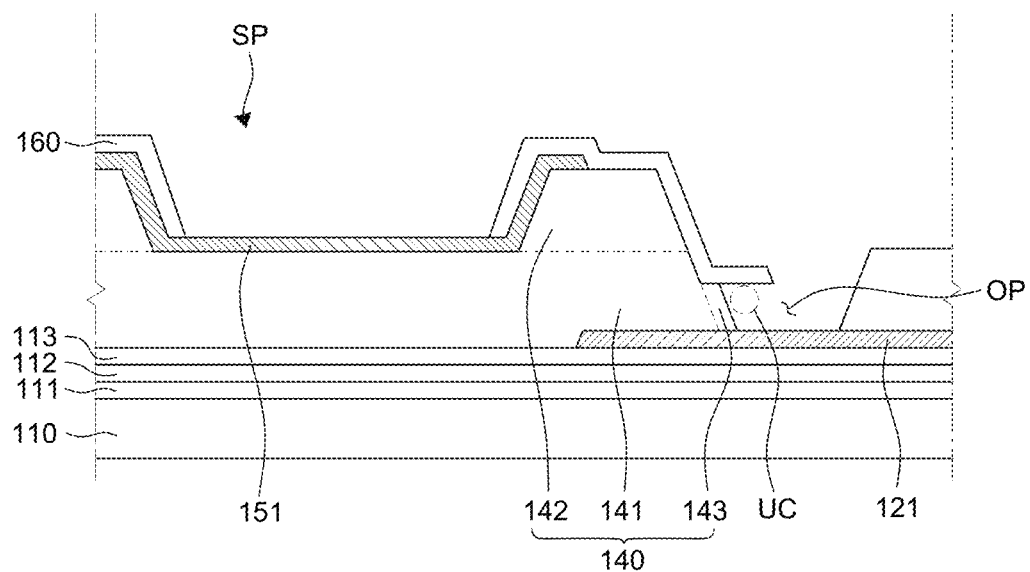

Referring to FIG. 5C, a part of the extension part 143' is etched by using the bank 160 to form the second base part 143. Thus, the under-cut region UC is formed under the bank 160, and the lower surface of the bank 160 may be exposed through the opening OP. That is, the end portion of the bank 160 may overlap with the opening OP. Also, the bank 160 may protrude from the upper surface of the second base part 143 so as to cover the opening OP. Herein, the under-cut region UC may refer to a region which is under the bank 160 and from which the extension part 143' is removed. When the under-cut region UC is formed, the opening OP that exposes the auxiliary line 121 may increase in size.

The under-cut region UC may be formed by dry etching using oxygen. When the dry etching is performed, only an organic material can be selectively removed. That is, it is possible to remove a part of the extension part 143' made of an organic material by using the bank 160 made of an inorganic material as a mask. In particular, the extension part 143' may be etched to expose the auxiliary line 121 made of an inorganic material. That is, only the extension part 143' can be easily removed due to the difference in material between the bank 160 and the auxiliary line 121 made of an inorganic material and the extension part 143' made of an organic material. The bank 160 protrudes from the upper surface of the second base part 143 so as to overlap with the opening OP. Thus, the organic layer 152 to be deposited later is not deposited in the under-cut region UC covered by the bank 160.

Figure 5D:
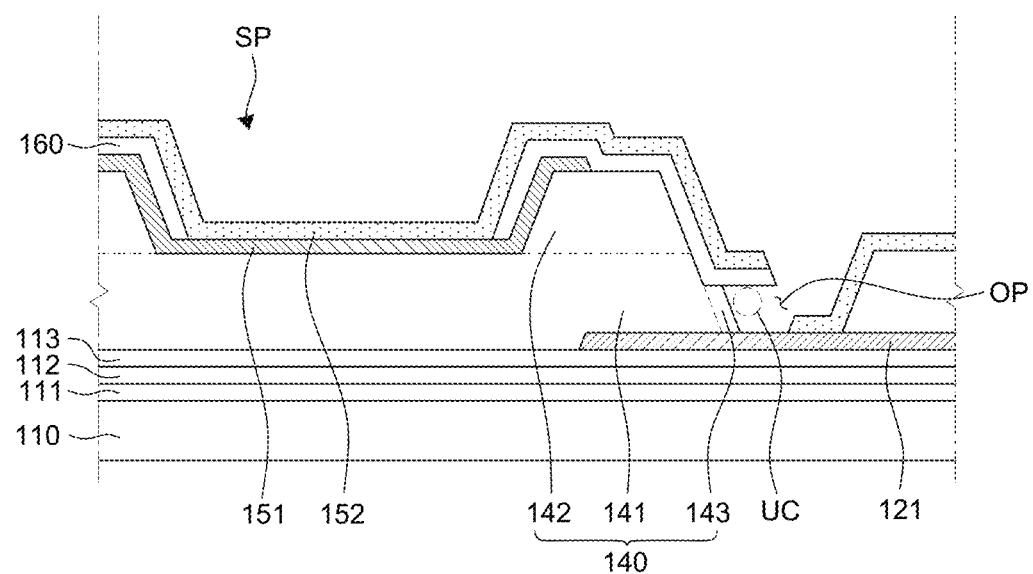

Referring to FIG. 5D, the organic layer 152 is formed on the first electrode 151, the bank 160 and the first base part 141. The organic layer 152 may have a disconnection structure in the region corresponding to the opening OP. Specifically, the organic layer 152 may be formed by a deposition process, such as evaporation, with linearity. Thus, the organic layer 152 may be disposed only on the first electrode 151, the bank 160 and the first base part 141 but not formed in the under-cut region UC covered by the bank 160. In other words, the organic layer 152 is not deposited on the side surface of the second base part 143 and the auxiliary line 121 within the opening OP overlapping with the bank 160. Since the organic layer 152 is discontinuously formed within the opening OP, the auxiliary line 121 may be exposed by the organic layer 152.

Figure 5E:
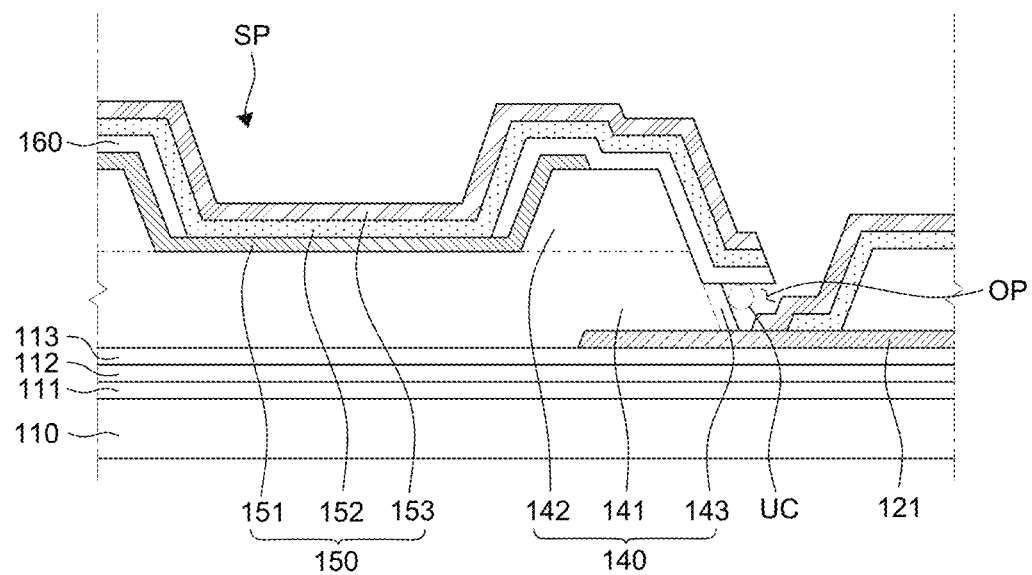

Referring to FIG. 5E, the second electrode 153 is formed on the organic layer 152. The second electrode 153 may have a disconnection structure in the region corresponding to the opening OP. However, the second electrode 153 may be formed by a deposition process, such as sputtering, with non-uniform directionality. Thus, the second electrode 153 may be deposited to a part of the auxiliary line 121 within the opening OP while covering the end portion of the organic layer 152. In particular, the second electrode 153 may be formed to a part of the auxiliary line 121 corresponding to the under-cut region UC. That is, the second electrode 153 may also be deposited on a part of the auxiliary line 121 overlapping with the bank 160 within the opening OP. Therefore, the second electrode 153 can be easily brought into contact with the auxiliary line 121 in the opening OP. Accordingly, it is possible to reduce a resistance of the second electrode 153 and improve luminance uniformity of the display device 100.

The exemplary embodiments of the present disclosure can also be described as follows:

According to an aspect of the present disclosure, a display device includes: a substrate including a plurality of sub-pixels; an auxiliary line disposed between the plurality of sub-pixels on the substrate; an overcoating layer including a base part having an opening that exposes the auxiliary line and a plurality of protrusion parts protruding from the base part; a first electrode corresponding to each of the plurality of sub-pixels and covering the base part and the plurality of protrusion parts; a bank on a part of the first electrode; an organic layer on the first electrode and the bank; and a second electrode on the organic layer and in contact with the auxiliary line exposed through the opening. An end portion of the bank overlaps with the opening.

An end portion of the organic layer in contact with the bank may overlap with the opening.

The organic layer may be discontinuously disposed on a first side and a second side of a region corresponding to the opening, and the first side is opposite to the second side.

The organic layer may be disposed to expose the auxiliary line within the opening, and the second electrode may extend to an upper surface of the auxiliary line while covering an end portion of the organic layer within the opening.

An end portion of the second electrode in contact with the auxiliary line may overlap with the bank.

The base part may include: a first base part; and a second base part extending from an end portion of the first base part and having a lower height than the first base part. A side surface of the second base part may be exposed through the opening.

The bank may protrude from an upper surface of the second base part so as to overlap with the opening.

The bank may be made of an inorganic material and the overcoating layer may be made of an organic material.

A lower surface of the bank may be exposed through the opening.

The bank may be spaced apart from the auxiliary line.

The display device may further include a low-potential power supply line disposed along a circumference of the substrate. The auxiliary line may be connected to the low-potential power supply line.

According to another aspect of the present disclosure, a display device include: a substrate including a plurality of sub-pixels; an auxiliary line disposed between the plurality of sub-pixels on the substrate; an overcoating layer including a base part having an opening that exposes the auxiliary line and a plurality of protrusion parts; a first electrode covering the base part and the plurality of protrusion parts; a bank on a part of the first electrode and made of an inorganic material; an organic layer on the first electrode and the bank; and a second electrode on the organic layer and electrically connected to the auxiliary line. An end portion of the bank is disposed to cover the opening while being spaced apart from the auxiliary line.

The organic layer may cover a part of the auxiliary line within the opening, and the second electrode may be in contact with the auxiliary line while covering an end portion of the organic layer within the opening.

The opening may include an under-cut region where a lower surface of the bank is exposed.

The organic layer may not be disposed in the under-cut region.

An end portion of the second electrode disposed in the opening may overlap with the bank.

The organic layer may be discontinuously disposed on a first side and a second side of a region corresponding to the opening, and the first side is opposite to the second side.

The base part may include a first part and a second part between the first part and the opening. An upper surface of the second part may be disposed lower than an upper surface of the first part.

The bank may protrude from the upper surface of the second part so as to overlap with the opening.

The display device may further include a low-potential power supply line disposed along a circumference of the substrate. The auxiliary line may be connected to the low-potential power supply line.

According to another aspect of the present disclosure, a method of manufacturing a display device includes: disposing an auxiliary line on a substrate including a plurality of sub-pixels, wherein the auxiliary line is formed between the plurality of sub-pixels; disposing an overcoating layer on the substrate, wherein the overcoating layer includes a first base part, a plurality of protrusion parts protruding from the first base part and an extension part extending from first base part, and wherein an opening that exposes the auxiliary line is formed between the first base part and the extension part; disposing a first electrode corresponding to each of the plurality of sub-pixels, on the first base part and the plurality of protrusion parts; disposing a bank on a part of the first electrode; etching a part of the extension part by using the bank to form a second base part, wherein the bank protrudes from an upper surface of the second base part to overlap with the opening; disposing an organic layer on the first electrode and the bank; and disposing a second electrode on the organic layer, wherein the second electrode is in contact with the auxiliary line exposed through the opening.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a substrate including a plurality of sub-pixels;
   an auxiliary line disposed between the plurality of sub-pixels on the substrate;
   an overcoating layer including a base part having an opening that exposes the auxiliary line and a plurality of protrusion parts protruding from the base part;

a first electrode corresponding to each of the plurality of sub-pixels and covering the base part and the plurality of protrusion parts;
a bank on a part of the first electrode;
an organic layer on the first electrode and the bank; and
a second electrode on the organic layer and in contact with the auxiliary line exposed through the opening,
wherein an end portion of the bank overlaps with the opening,
wherein the base part includes:
a first base part; and
a second base part extending from an end portion of the first base part and having a lower height than the first base part, and
wherein a distance between an upper surface of the first base part and an upper surface of the substrate is larger than a distance between an upper surface of the second base part and the upper surface of the substrate.

2. The display device according to claim 1, wherein an end portion of the organic layer in contact with the bank overlaps with the opening.

3. The display device according to claim 1, wherein the organic layer is discontinuously disposed on a first side and a second side of a region corresponding to the opening, wherein the first side is opposite to the second side.

4. The display device according to claim 1, wherein the organic layer is disposed to expose the auxiliary line within the opening, and
wherein the second electrode extends to an upper surface of the auxiliary line while covering an end portion of the organic layer within the opening.

5. The display device according to claim 1, wherein an end portion of the second electrode in contact with the auxiliary line overlaps with the bank.

6. The display device according to claim 1, wherein a side surface of the second base part is exposed through the opening.

7. The display device according to claim 6, wherein the bank protrudes from an upper surface of the second base part so as to overlap with the opening.

8. The display device according to claim 1, wherein the bank is made of an inorganic material and the overcoating layer is made of an organic material.

9. The display device according to claim 1, wherein a lower surface of the bank is exposed through the opening.

10. The display device according to claim 1, wherein the bank is spaced apart from the auxiliary line.

11. The display device according to claim 1, further comprising:
a low-potential power supply line disposed along a circumference of the substrate,
wherein the auxiliary line is connected to the low-potential power supply line.

12. A display device, comprising:
a substrate including a plurality of sub-pixels;
an auxiliary line disposed between the plurality of sub-pixels on the substrate;
an overcoating layer including a base part having an opening that exposes the auxiliary line and a plurality of protrusion parts;
a first electrode covering the base part and the plurality of protrusion parts;
a bank on a part of the first electrode and made of an inorganic material;
an organic layer on the first electrode and the bank; and
a second electrode on the organic layer and electrically connected to the auxiliary line,
wherein an end portion of the bank is disposed to cover the opening while being spaced apart from the auxiliary line,
wherein the base part includes:
a first part; and
a second part between the first part and the opening, and having a lower height than the first part, and,
wherein a distance between an upper surface of the first part and an upper surface of the substrate is larger than a distance between an upper surface of the second part and the upper surface of the substrate.

13. The display device according to claim 12, wherein the organic layer covers a part of the auxiliary line within the opening, and
the second electrode is in contact with the auxiliary line while covering an end portion of the organic layer within the opening.

14. The display device according to claim 12, wherein the opening includes an under-cut region where a lower surface of the bank is exposed.

15. The display device according to claim 14, wherein the organic layer is not disposed in the under-cut region.

16. The display device according to claim 12, wherein an end portion of the second electrode disposed in the opening overlaps with the bank.

17. The display device according to claim 12, wherein the organic layer is discontinuously disposed on a first side and a second side of a region corresponding to the opening, wherein the first side is opposite to the second side.

18. The display device according to claim 12, wherein the upper surface of the second part is disposed lower than the upper surface of the first part.

19. The display device according to claim 18, wherein the bank protrudes from the upper surface of the second part so as to overlap with the opening.

20. The display device according to claim 12, further comprising:
a low-potential power supply line disposed along a circumference of the substrate,
wherein the auxiliary line is connected to the low-potential power supply line.

* * * * *